US009823140B2

(12) United States Patent
Morinaga (10) Patent No.: US 9,823,140 B2
(45) Date of Patent: Nov. 21, 2017

(54) SENSOR ABNORMALITY DETERMINING APPARATUS

(71) Applicant: Nissan Motor Co., Ltd., Yokohama-shi, Kanagawa (JP)

(72) Inventor: Hatsuki Morinaga, Kanagawa (JP)

(73) Assignee: Nissan Motor Co., Ltd., Yokohama (JP)

( * ) Notice: Subject to any disclaimer, the term of this patent is extended or adjusted under 35 U.S.C. 154(b) by 38 days.

(21) Appl. No.: 14/906,568

(22) PCT Filed: Jul. 31, 2014

(86) PCT No.: PCT/JP2014/070172
§ 371 (c)(1),
(2) Date: Jan. 21, 2016

(87) PCT Pub. No.: WO2015/029686
PCT Pub. Date: Mar. 5, 2015

(65) Prior Publication Data
US 2016/0161347 A1   Jun. 9, 2016

(30) Foreign Application Priority Data

Aug. 28, 2013 (JP) .................................. 2013-176708

(51) Int. Cl.
*G01K 17/00* (2006.01)
*G01K 15/00* (2006.01)
(Continued)

(52) U.S. Cl.
CPC ........... *G01K 15/007* (2013.01); *G01K 17/08* (2013.01); *H05K 7/20218* (2013.01); *H05K 7/20927* (2013.01); *H05K 7/20945* (2013.01)

(58) Field of Classification Search
CPC ........... H05K 7/20945; H05K 7/20218; H05K 7/20381; F24H 9/2007; H05B 1/0283;
(Continued)

(56) References Cited

U.S. PATENT DOCUMENTS 4,895,005 A * 1/1990 Norbeck ................ H02K 17/30
174/15.1
5,337,574 A * 8/1994 Dick ........................ F24F 1/022
165/244

(Continued)

FOREIGN PATENT DOCUMENTS

CN          1075993 A     9/1993
CN          102883475 A * 1/2013 ........... A01K 63/065
(Continued)

*Primary Examiner* — Gail Kaplan Verbitsky
(74) *Attorney, Agent, or Firm* — Global IP Counselors, LLP (57) ABSTRACT

A sensor abnormality determining apparatus is applied to an inverter that includes: a power element; a cooling water circulation path for cooling the power element; a temperature sensor that detects a temperature of the power element; and a water temperature sensor that detects a temperature of the cooling water circulating in the cooling water circulation path. The sensor abnormality determining apparatus includes: an abnormality determining section and a determination temperature setting section. The abnormality determining section determines the temperature sensor is abnormal when a temperature difference between the detected power element temperature and the detected water temperature is larger than a prescribed determination temperature difference. The determination temperature setting section sets the prescribed determination temperature difference to a lower value when the detected power element temperature is lower than the detected water temperature as compared to when the detected power element temperature is higher than the detected water temperature.

13 Claims, 3 Drawing Sheets

(51) Int. Cl.
*H05K 7/20* (2006.01)
*G01K 17/08* (2006.01)

(58) Field of Classification Search
CPC .......... G01K 15/007; G01K 3/08; G01K 3/10; G01K 17/00; G01K 17/06; G01K 17/08; G01K 15/00
USPC .......................................................... 324/500
See application file for complete search history.

(56) References Cited

U.S. PATENT DOCUMENTS

| | | | | |
|---|---|---|---|---|
| 5,388,178 | A * | 2/1995 | Moon | D06F 33/02 219/437 |
| 6,265,699 | B1 * | 7/2001 | Scott | A47J 31/56 219/481 |
| 6,291,826 | B1 * | 9/2001 | Kubo | G01K 7/015 250/338.4 |
| 8,406,932 | B2 * | 3/2013 | Hollaway | A61H 33/005 219/437 |
| 2005/0213634 | A1 | 9/2005 | Sadeh | G01K 15/00 374/147 |
| 2007/0098043 | A1 * | 5/2007 | Wang | G01K 1/02 374/208 |
| 2007/0183758 | A1 * | 8/2007 | Bradenbaugh | F24H 9/2021 392/478 |
| 2008/0049811 | A1 * | 2/2008 | Hirano | G01K 1/026 374/100 |
| 2008/0174629 | A1 * | 7/2008 | Suzuki | B41J 2/04563 347/19 |
| 2009/0132066 | A1 * | 5/2009 | Hollaway | A61H 33/005 700/81 |
| 2010/0258194 | A1 * | 10/2010 | Kim | F24D 19/1015 137/1 |
| 2010/0326127 | A1 * | 12/2010 | Oomura | B60H 1/00785 62/498 |
| 2012/0265473 | A1 * | 10/2012 | Arisaka | G01K 7/01 702/99 |
| 2014/0197155 | A1 * | 7/2014 | Takahashi | H05B 1/0238 219/498 |
| 2015/0204730 | A1 * | 7/2015 | Daitoku | G01K 7/01 374/178 |
| 2016/0003688 | A1 * | 1/2016 | Luber | G01K 15/007 361/103 |

FOREIGN PATENT DOCUMENTS

| | | | | |
|---|---|---|---|---|
| FR | | 2868605 A1 * | 10/2005 | ........ H01M 8/04029 |
| JP | | 2008-5615 A | 1/2008 | |
| JP | | 2008-256313 A | 10/2008 | |
| JP | | 2009-284597 A | 12/2009 | |
| JP | | 2010-153567 A | 7/2010 | |

* cited by examiner

SENSOR ABNORMALITY DETERMINING APPARATUS

CROSS-REFERENCE TO RELATED APPLICATIONS

This application is a U.S. National stage application of International Application No. PCT/JP2014/070172, filed Jul. 31, 2014, which claims priority to Japanese Patent Application No. 2013-176708 filed in Japan on Aug. 28, 2013. The entire disclosure of Japanese Patent Application No. 2013-176708 is hereby incorporated herein by reference.

BACKGROUND

Field of the Invention

The present invention relates to a sensor abnormality determining apparatus that determines an abnormality in the temperature sensor, which detects the temperature of a power element based on the difference between the temperature of the power element and the temperature of the cooling water for cooling the power element.

Background Information

Conventionally, the temperature of the cooling water for cooling the power element is inferred based on the temperature of the power element. A sensor abnormality determining apparatus that determines that there is an abnormality in the cooling water temperature sensor when the deviation between the inferred cooling water temperature and the actual cooling water temperature actually detected using the cooling water temperature sensor is equal to or greater than a predetermined abnormality determining threshold (for example, refer to Japanese Laid-Open Patent Application No. 2009-284597). This sensor abnormality determining apparatus does not execute an abnormality determination of the cooling water temperature sensor when the inferred cooling water temperature is equal to or greater than an upper limit value.

SUMMARY

In a conventional sensor abnormality determining apparatus, the focus is only on the deviation between the inferred cooling water temperature and the actual cooling water temperature, and the abnormality determining threshold which serves as a reference for the abnormality determination of the cooling water temperature sensor is a constant value. That is, the abnormality determining threshold with respect to the deviation when the inferred cooling water temperature is higher than the actual cooling water temperature, and the abnormality determining threshold with respect to the deviation when the inferred cooling water temperature is lower than the actual cooling water are set to the same value. Here, when an electric current is applied to a power element, the temperature of the power element rises. Accordingly, it is known that the inferred cooling water temperature which is inferred based on the temperature of the power element also rises, and the deviation between the inferred cooling water temperature and the actual cooling water temperature is increased. Therefore, the abnormality determining threshold must be set to a larger value than the temperature deviation that occurs when the maximum current is applied to the power element, in order to prevent erroneous determination. Consequently, there is the problem that the cooling water temperature sensor cannot determine an abnormality unless the deviation between the inferred cooling water temperature and the actual cooling water temperature increases to a certain degree.

In view of the problems described above, an object of the present invention is to provide a sensor abnormality determining apparatus that can detect an abnormality of a temperature sensor for detecting the temperature of a power element, even when the deviation between the temperature of the power element and the temperature of the cooling water for cooling the power element is low.

In order to achieve the object above, the sensor abnormality determining apparatus of the present invention is applied to a semiconductor module that is provided with a power element, a cooling water circuit having cooling water for cooling the power element circulating therein, a temperature sensor which detects a temperature of the power element, and a water temperature sensor which detects a temperature of the cooling water circulating in the cooling water circuit, and comprises an abnormality determining section and a determination temperature setting section. The abnormality determining section determines that the temperature sensor is abnormal when the difference between the temperature detected by the temperature sensor and the water temperature detected by the water temperature sensor is higher than a determination temperature difference set in advance. The determination temperature setting section sets the determination temperature difference of when the temperature detected by the temperature sensor is lower than the water temperature detected by the water temperature sensor to a lower value than the determination temperature difference of when the temperature detected by the temperature sensor is higher than the water temperature detected by the water temperature sensor.

In the sensor abnormality determining apparatus of the present invention, the temperature sensor is determined to be abnormal when the difference between the temperature detected by the temperature sensor and the water temperature detected by the water temperature sensor is higher than a predetermined determination temperature difference by an abnormality determining section. Here, the determination temperature difference, which serves as a reference for the abnormality determination, is set to a lower value when the temperature detected by the temperature sensor is lower than the water temperature detected by the water temperature sensor, compared to when the temperature detected by the temperature sensor is higher than the water temperature detected by the water temperature sensor.

That is, the temperature rise of the power element due to an electric current applied to the power element is thought to be suppressed when the temperature detected by the temperature sensor is lower than the temperature detected by the water temperature sensor. On the other hand, when the temperature detected by the temperature sensor is higher than the temperature detected by the water temperature sensor, it is thought that a relatively large electric current is applied to the power element and the temperature of the power element is raised. Additionally, when the temperature rise of the power element is suppressed, the difference between the temperature detected by the temperature sensor and the temperature detected by the water temperature sensor becomes lower.

Therefore, an abnormality of the temperature sensor can be determined even if the difference between the temperature detected by the temperature sensor and the water temperature detected by the water temperature sensor is low, by setting the determination temperature difference of when the electric current applied to the power element is low and the temperature rise of the power element is thought to be suppressed, to a lower value than the determination temperature difference of when the temperature of the power element is thought to be raised.

BRIEF DESCRIPTION OF THE DRAWINGS

Referring now to the attached drawings which form a part of this original disclosure.

DETAILED DESCRIPTION OF THE EMBODIMENTS

An embodiment for implementing the sensor abnormality determining apparatus of the present invention is described below, based on the first embodiment illustrated in the drawings.

First Embodiment

The "overall system configuration of the motor unit," and the "configuration of the temperature sensor abnormality determining steps" will be separately described regarding the configuration of the sensor abnormality determining apparatus of the first embodiment.

Overall System Configuration of the Motor Unit

Figure 1:
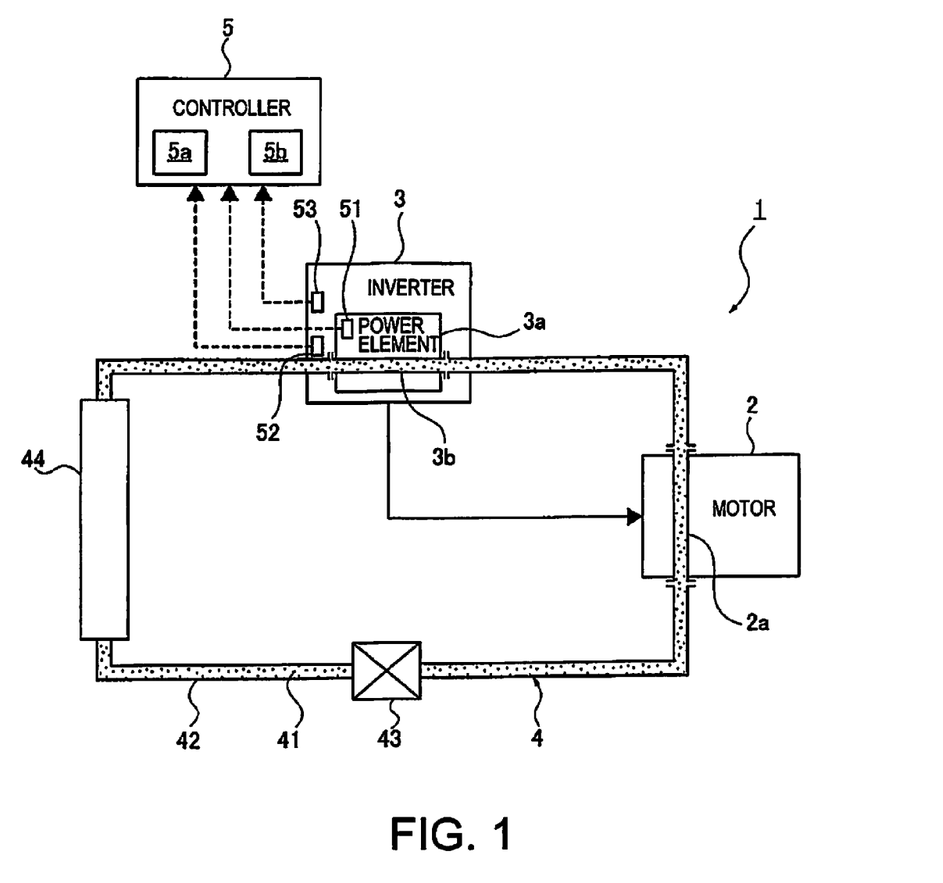
FIG. 1 is an overall system view illustrating a motor unit equipped with a sensor abnormality determining apparatus of the first embodiment.

FIG. 1 is an overall system view illustrating a motor unit equipped with a sensor abnormality determining apparatus of the first embodiment. The overall system configuration of the motor unit equipped with a sensor abnormality determining apparatus of the first embodiment will be described below based on FIG. 1.

The sensor abnormality determining apparatus in the first embodiment is mounted on a motor unit 1, which is illustrated in FIG. 1. That is, the motor unit 1 is mounted as a travel drive source of an electric vehicle (not diagrammed) such as a hybrid vehicle or an electric automobile. The motor unit 1 comprises a motor 2, an inverter (semiconductor module) 3, and a cooling system 4.

The motor 2 is a synchronous motor, in which a permanent magnet is embedded in the rotor and a stator coil is wound on the stator. The motor 2 comprises a motor water jacket 2a, in which flows a cooling water 41, described below, of the cooling system 4.

The inverter 3 comprises a power element 3a, produces a three-phase AC power to apply to the motor 2 based on a control command from a motor controller, which is not shown, and controls the motor 2. The power element 3a is, for example, an IGBT (Insulated Gate Bipolar Transistor) module playing a major role as the main switch of the inverter that outputs a three-phase AC power. The power element 3a comprises a power element water jacket 3b, in which the cooling water 41 flows.

Additionally, the inverter 3 is provided with a temperature sensor 51 which detects the temperature of the power element 3a, a water temperature sensor 52 which detects the temperature of the cooling water 41 flowing in the power element water jacket 3b, and a current sensor 53 which detects the electric current applied to the power element 3a.

The cooling system 4 comprises a cooling water circulation path (cooling water circuit) 42 having cooling water 41 for cooling the motor 2 and the power element 3a of the inverter 3 circulating therein, a water pump 43, and a radiator 44. The cooling water 41 is an antifreeze (LLC; coolant). The cooling water circulation path 42 is a flow channel through which the cooling water 41 flows, and connects the water pump 43, the motor water jacket 2a, the power element water jacket 3b, the radiator 44, and back to the water pump 43, in that order, along the flow of the cooling water 41. The water pump 43 is an electrically-operated pump which forcibly circulates the cooling water 41 within the cooling water circulation path 42, by applying pressure to the cooling water 41 flowing in the cooling water circulation path 42. The radiator 44 is provided at an intermediate position of the cooling water circulation path 42 and cools the cooling water 41 which is sucked into the water pump 43, by causing the cooling water 41 to exchange heat with the outside air.

That is, in the cooling system 4, the cooling water 41 fed by the water pump 43 first carries out a heat exchange with the motor 2 in the motor water jacket 2a and cools the motor 2. Thereafter, the cooling water flows into the power element water jacket 3b provided to the power element 3a of the inverter 3. Then, the cooling water carries out a heat exchange with the power element 3a in the power element water jacket 3b and cools the power element 3a. Then, after flowing into the radiator 44 and being air-cooled, the cooling water is sucked into the water pump 43 again and fed.

Additionally, the motor unit 1 is provided with a control device (sensor abnormality determining apparatus) 5. Various detection signals are inputted into the control device 5 from a temperature sensor 51, a water temperature sensor 52, and a current sensor 53. The control device 5 is for carrying out the abnormality determination of the temperature sensor 51 by executing a temperature sensor abnormality determining steps described below, and comprises an abnormality determining section 5a and a determination temperature setting section 5b.

The abnormality determining section 5a is an arithmetic operation circuit which determines that the temperature sensor 51 is abnormal when the difference between the temperature detected by the temperature sensor 51 and the water temperature detected by the water temperature sensor 52 is higher than a determination temperature difference set in advance. In addition, the abnormality determination of the temperature sensor 51 is not carried out in the abnormality determining section 5a, when the electric current applied to the power element 3a is equal to or greater than a first electric current determination value lmth1 set in advance. On the other hand, the abnormality determination of the temperature sensor 51 is carried out if all of the following conditions are met: the electric current applied to the power element 3a remains equal to or less than a second electric current determination value lmth2 set in advance for a predetermined time; the vehicle is stopped; and a predetermined time has elapsed since the cooling water 41 circulated the cooling water circulation path 42.

The determination temperature setting section 5b is an arithmetic operation circuit which sets the determination temperature difference used in the abnormality determining section 5a. The determination temperature setting section 5b sets the determination temperature difference of when the temperature detected by the temperature sensor 51 is lower than the water temperature detected by the water temperature sensor 52 to a lower value than the determination temperature difference of when the temperature detected by the temperature sensor 51 is higher than the water temperature detected by the water temperature sensor 52.

Configuration of the Temperature Sensor Abnormality Determining Steps

Figure 2:
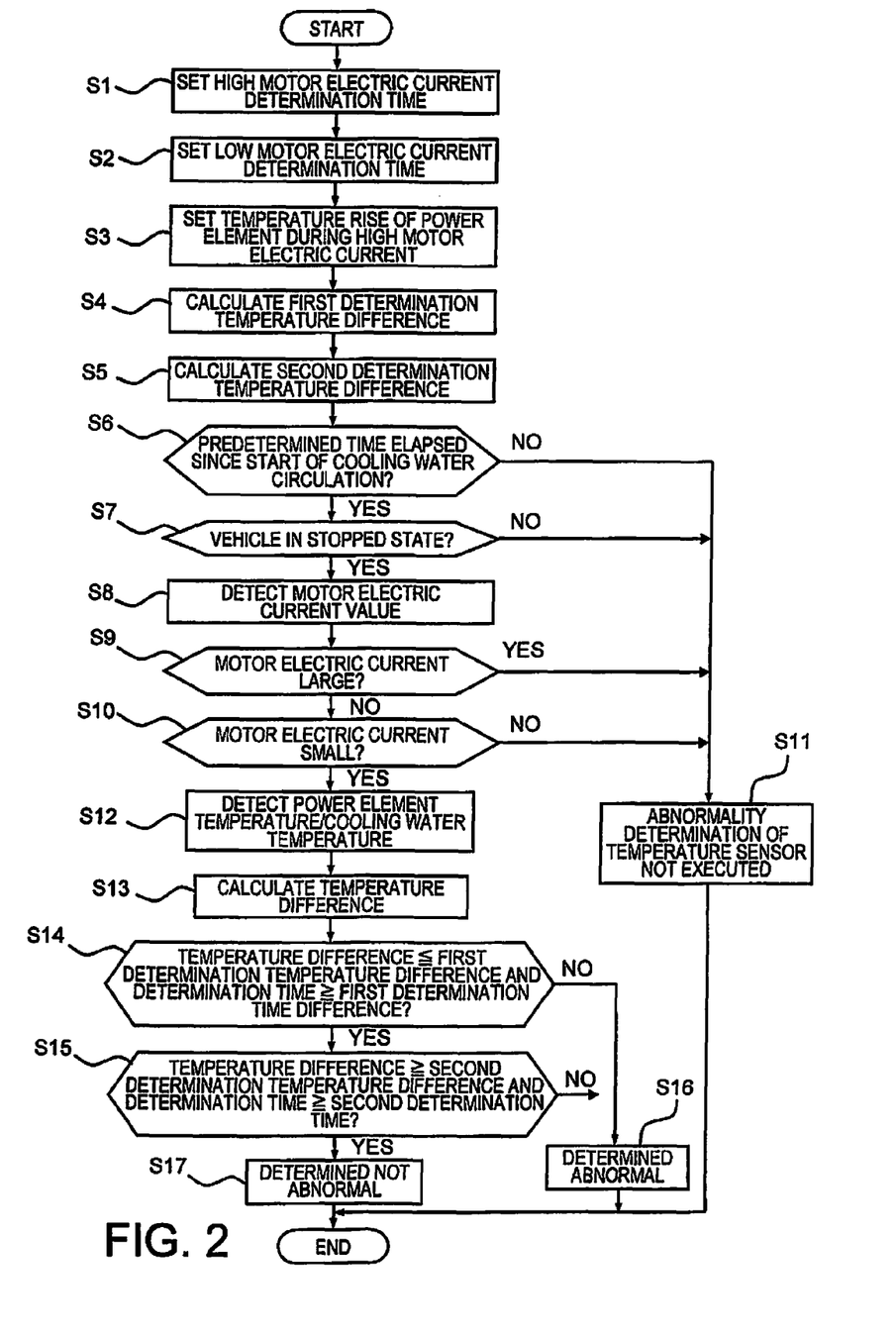
FIG. 2 is a flowchart illustrating the flow of the temperature sensor abnormality determining steps carried out in a sensor abnormality determining apparatus of the first embodiment.

FIG. 2 is a flowchart illustrating the flow of the temperature sensor abnormality determining steps carried out in a control device of the first embodiment. The configuration of the temperature sensor abnormality determining steps of the first embodiment will be described below based on FIG. 2.

In step S1, a high motor electric current determination time Tth1 is set, and the process proceeds to step S2. Here, a "high motor electric current determination time" is the time which serves as a determination reference for determining whether or not the electric current (motor electric current value) applied to the motor 2, in other words, the electric current applied to the power element 3a of the inverter 3 is large. The electric current applied to the power element 3a is determined to be "high" when the current is larger than a first electric current determination value lmth1 set in advance. Additionally, the "high motor electric current determination time" is set to a determination margin time which takes into consideration, for example, the noise component of the motor electric current.

In step S2, following the setting of the high motor electric current determination time Tth1 in step S1, a low motor electric current determination time Tth2 is set, and the process proceeds to step S3. Here, a "low motor electric current determination time" is the time which serves as a determination reference for determining whether or not the electric current (motor electric current value) applied to the motor 2, in other words, the electric current applied to the power element 3a of the inverter 3 is small. The electric current applied to the power element 3a is determined to be "low" when the current is smaller than a second electric current determination value lmth2 set in advance. Additionally, the "low motor electric current determination time" is set to a determination margin time which takes into consideration, for example, the noise component of the motor electric current, with consideration given to the thermal time constant of the power element 3a.

In step S3, following the setting of the low motor electric current determination time Tth2 in step S2, the increased temperature of the power element 3a during a high motor electric current is set, and the process proceeds to step S4. Here, the power element 3a produces heat when electric current is applied, and the temperature is increased as the applied electric current is increased. In other words, in step S3, since the temperature of the power element 3a rises when a motor electric current value (first electric current determination value lmth1) determined to be high is being applied, the power element temperature that rises by the first electric current determination value lmth1 being applied is set. A map is created in advance by calculating or measuring the increased temperature of the power element 3a with respect to the motor electric current, and the temperature rise is set based on this map.

In step S4, following the setting of the increased temperature in step S3, a first determination temperature difference is calculated, and the process proceeds to step S5. Here, the "first determination temperature difference" is a value which serves as a reference when determining an abnormality of the temperature sensor 51 when the temperature of the power element 3a (the detected temperature detected by the temperature sensor 51) is higher than the temperature of the cooling water 41 (the detected water temperature detected by the water temperature sensor 52). The "first determination temperature difference" is obtained based on the following Formula (1).

$$\text{Second determination temperature difference} = \text{detection error} + \text{increased temperature} + \text{determination margin} \quad (1)$$

The "increased temperature" in Formula (1) is the value determined in step S3.

In step S5, following the calculation of the first determination temperature difference in step S4, a second determination temperature difference is calculated, and the process proceeds to step S6. Here, the "second determination temperature difference" is a value which serves as a reference when determining an abnormality of the temperature sensor 51 when the temperature of the power element 3a (the detected temperature detected by the temperature sensor 51) is lower than the temperature of the cooling water 41 (the detected water temperature detected by the water temperature sensor 52). The "second determination temperature difference" is obtained based on the following Formula (2).

$$\text{Second determination temperature difference} = \text{detection error} + \text{determination margin} \quad (2)$$

In step S6, following the calculation of the second determination temperature difference in step S5, whether or not a predetermined time necessary for circulation set in advance has elapsed, since the cooling water 41 which cools the power element 3a has begun to circulate in the cooling water circulation path 42, is determined. If YES (the time necessary for circulation has elapsed), the process proceeds to step S7. If NO (the time necessary for circulation has not elapsed), it is determined that the cooling water 41 has not been sufficiently circulated, and the process proceeds to step S11. Here, the "time necessary for circulation" is the time thought to be necessary for the temperature distribution of the cooling water 41 circulating in the cooling water circulation path 42 to become even, and can be set to an arbitrary value.

In step S7, following a determination that the time necessary for circulation has elapsed in step S6, whether or not a vehicle equipped with a motor unit 1 is in a stopped state is determined. If YES (stopped), then the process proceeds to step S8. If NO (traveling), then it is determined that a motor torque necessary for traveling is outputted from the motor 2, and the process proceeds to step S11. Here, a determination that a vehicle is stopped is carried out when the vehicle speed detected by the vehicle speed sensor, which is not shown, is smaller than a predetermined value sufficient to determine that the car is stopped (=zero).

In step S8, following the determination that the vehicle is stopped in step S7, the electric current applied to the power element 3a of the inverter 3, which is a motor electric current value, is detected, and the process proceeds to step S9. The electric current applied to the power element 3a is detected by a current sensor 53.

In step S9, following the detection of the electric current in step S8, whether or not the motor electric current value (the electric current applied to the power element 3a) detected in step S8 is large will be determined. If YES (motor electric current is large), it is determined that the motor electric current is large and the temperature of the power element 3a is high, and the process proceeds to step S11. If NO (motor electric current is not large), the process proceeds to step S10. Here, a case in which the motor electric current is large is when a state in which the electric current applied to the power element 3a is larger than a first electric current determination value lmth1 set in advance continues for the duration of the high motor electric current determination time Tth1, which was set in step S1. The high motor electric current determination time Tth1 is a time set in order to avoid erroneously determining that the motor electric current is large due to the influence of current noise. In general, the thermal time constant of the power element 3a is sufficiently large with respect to the high motor electric current determination time Tth1 set in this manner, so there is not a problem. However, if the temperature rise of the power element 3a after the high motor electric current determination time Tth1 has elapsed cannot be ignored, the temperature rise of the power element 3a is calculated giving consideration to said temperature rise. Specifically, instead of determining from the map in step S3, calculation is performed from the following Formula (3).

$$\text{temperature rise} = \text{map detection temperature (the temperature rise determined based on the map)} + \text{the temperature rise of the power element } 3a \text{ after the high motor electric current determination time has elapsed in a state of maximum motor electric current} \quad (3)$$

In step S10, following the determination that the motor electric current is not large in step S9, whether or not the motor electric current value (the electric current applied to the power element 3a) detected in step S8 is small is determined. If YES (motor electric current is small), the process proceeds to step S12. If NO (motor electric current is not small), it is determined that the motor electric current is not small and the temperature of the power element 3a is expected to be somewhat high, and the process proceeds to step S11. Here, a case in which the motor electric current is small is when a state in which the electric current applied to the power element 3a is smaller than a second electric current determination value lmth2 set in advance continues for the duration of the low motor electric current determination time Tth2, which was set in step S2.

In step S11, following a determination that the necessary time for circulation has not elapsed in step S6, a determination that the vehicle is traveling in step S7, a determination that the motor electric current is large in step S9, or, a determination that the motor electric current is not small in step S10, an abnormality determination of the temperature sensor 51 is not executed and the process ends. That is, if the predetermined time necessary for circulation has not elapsed since the cooling water 41 started to circulate, the cooling water temperature distribution in the cooling water circulation path 42 is thought to be not even, and that variation (unevenness) remains. Therefore, the influence of the variation (unevenness) in the cooling water temperature distribution detected by the water temperature sensor 52 is reflected on the cooling water temperature detected by the water temperature sensor 52, and the abnormality determination of the temperature sensor 51 could be erroneously determined. Additionally, when the vehicle is traveling, it is thought that a relatively large electric current is applied to the power element 3a of the inverter 3, in order to output the necessary motor torque from the motor 2. Additionally, even if the vehicle is not traveling, as long as the electric current applied to the power element 3a is large to a certain degree, the power element temperature rises and the temperature difference from the cooling water 41 is increased. Therefore, it is conceivable that the abnormality determination of the temperature sensor 51 is erroneously determined. In this manner, when it is conceivable that an erroneous determination is made in the abnormality determination of the temperature sensor 51, the process proceeds to step S11 and an abnormality determination of the temperature sensor 51 is not executed.

In step S12, following a determination that the motor electric current is small in step S10, the temperature of the power element 3a is detected by the temperature sensor 51, and the temperature of the cooling water 41 which flows in the power element water jacket 3b is detected by the water temperature sensor 52, and the process proceeds to step S13.

In step S13, following a detection of the power element temperature and the cooling water temperature in step S12, the difference between the temperature of the power element 3a and the temperature of the cooling water 41 (hereinafter referred to as temperature difference $\Delta T$) detected in step S12 is calculated, and the process proceeds to step S14. The temperature difference $\Delta T$ is obtained based on the following Formula (4).

$$\text{temperature difference } \Delta T = \text{temperature of the power element } 3a - \text{temperature of the cooling water } 41 \quad (4)$$

In step S14, following the calculation of the temperature difference $\Delta T$ in step S13, whether or not the temperature difference $\Delta T$ calculated in step S13 is equal to or less than the first determination temperature difference set in step S4, and a state in which this temperature difference $\Delta T \leq$ first determination temperature difference has continued for the length of the first determination time set in advance, is determined. If YES (temperature difference $\Delta T \leq$ first determination temperature difference, and, determination time $\geq$ first determination time), the process proceeds to step S15. If NO (temperature difference $\Delta T >$ first determination temperature difference, or, determination time $<$ first determination time), the process proceeds to step S16. The "first determination time" is the length of time with which the effects of the noise of the temperature of the power element 3a and the temperature of the cooling water 41 can be avoided, and can be set to an arbitrary value.

In step S15, following a determination in step S14 that the temperature difference $\Delta T \leq$ g a first determination temperature difference, and, a determination time $\geq$ a first determination time, whether or not the temperature difference $\Delta T$ calculated in step S13 is equal to or greater than the second determination temperature difference set in step S5, and a state in which this temperature difference $\Delta T \geq$ a second determination temperature difference has continued for the length of the second determination time set in advance, is determined. If YES (temperature difference $\Delta T \geq$ second determination temperature difference, and, the determination time $\geq$ a second determination time), the process proceeds to step S17. If NO (temperature difference $\Delta T <$ a second determination temperature difference, or, the determination time $<$ a second determination time), the process proceeds to step S16. The "second determination time" is the length of time with which the effects of the noise of the temperature of the power element 3a and the temperature of the cooling water 41 can be avoided, and can be set to an arbitrary value.

In step S16, following a determination in step S14 that the temperature difference $\Delta T >$ the first determination temperature difference, or, the determination time $<$ the first determination time, or, following the determination in step S15 that the temperature difference $\Delta T <$ the second determination temperature difference, or, the determination time $<$ the second determination time, the temperature difference $\Delta T$ is determined assumed to be large, an abnormality is determined to be occurring in the temperature sensor 51, and the process ends.

In step S17, following a determination in step S15 that the temperature difference ΔT≥the second determination temperature difference, and, the determination time≥the second determination time, the temperature difference ΔT is assumed as being within a predetermined range (equal to or greater than the second determination temperature difference and equal to or less than the first determination temperature difference), an abnormality is determined not to be occurring in the temperature sensor 51, and the process ends.

Next, the actions are described. First, the "problem in the sensor abnormality determining apparatus of a comparative example" will be described, and then, the "abnormality determination action" in the sensor abnormality determining apparatus of the first embodiment will be described.

Problem in the Sensor Abnormality Determining Apparatus of a Comparative Example A motor control unit which acts as a traveling drive of an electric automobile is controlled so that the necessary motor torque is generated by applying an appropriate electric current to the motor. Here, in order to apply the appropriate electric current to the motor, an inverter comprising a power element is disposed between a power source and the motor, and a power element 3a is pulse driven so that the electric current applied to the motor becomes the target value.

In general, the heat generation amount of a power element increases in accordance with the electric current of the power element. In addition, a power element has a heat generation limit, and temperature management is necessary so that an adequate temperature which does not exceed this heat generation limit is achieved. Therefore, unless the temperature of the power element is detected by a temperature sensor and the electric current of the power element is controlled in accordance with the detected temperature, there is the risk that the temperature of the power element exceeds the heat generation limit and is damaged.

When an abnormality occurs in a temperature sensor, there is also the risk that the power element will be damaged, unless the presence of the abnormality is detected and a necessary electric current control is carried out. Here, as abnormalities of a temperature sensor, there are cases in which the sensor output becomes 0V, or cases in which the output becomes equivalent to the power source voltage, and, in general, an abnormality is determined to have occurred when the sensor output exceeds a certain range. However, an abnormality cannot be detected with the above-described method when the abnormality is such that: the sensor output is fixed at an intermediate value; the sensor output is offset by a predetermined range; or the sensor output gain with respect to the temperature is different from the reference.

Therefore, a method is conceivable in which one power element is provided with a plurality of temperature sensors and an abnormality is determined to have occurred when the sensor output from the respective temperature sensors differ from one another. However, this method requires each power element to be equipped with at least 2 temperature sensors, and thus problems of sensor equipping space and increased cost are generated.

Abnormality Determination Action

Figure 3:
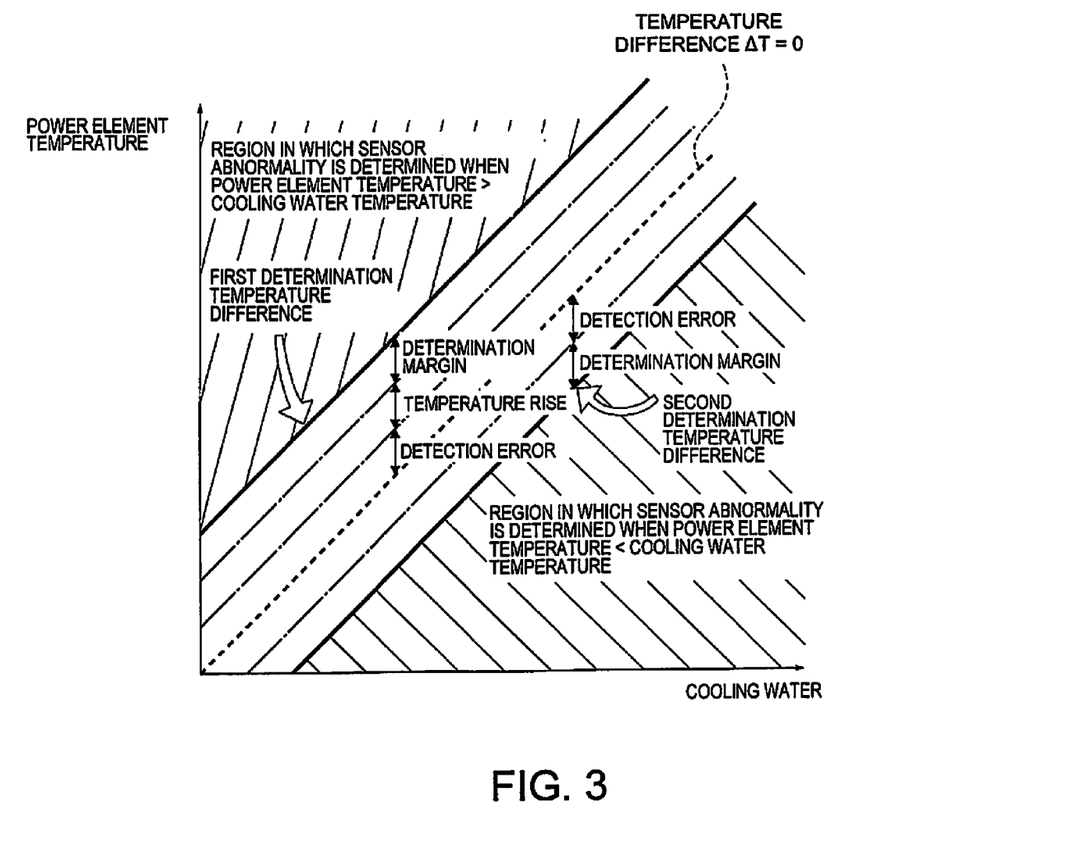
FIG. 3 is a conceptual view illustrating the abnormal determination region and the normal determination region of the sensor abnormality determining apparatus of the first embodiment.

FIG. 3 is a conceptual view illustrating the abnormal determination region and the normal determination region of the sensor abnormality determining apparatus of the first embodiment. The abnormality determination action of the first embodiment will be described below based on FIG. 3.

To execute an abnormality determination of the temperature sensor 51 in the first embodiment, the temperature sensor abnormality determining steps illustrated in the flowchart of FIG. 2 is executed. That is, in FIG. 2, the steps proceeds in the order of step S1→step S2→step S3, and the "high motor electric current determination time Tth1", the "low motor electric current determination time Tth2", and the "temperature rise of the power element 3a during high motor electric current" are set, respectively. Then, once the values are set, the process proceeds to step S4 and then to step S5, and the "first determination temperature difference" and the "second determination temperature difference" are calculated.

Here, the "first determination temperature difference" is a value which serves as a reference when determining an abnormality of the temperature sensor 51 while the power element temperature is higher than the cooling water temperature. As mentioned above, the heat generation amount of a power element increases in accordance with the electric current applied to the power element; therefore, the more the electric current is applied, the more the power element temperature rises. In this case, the power element 3a is cooled by carrying out a heat exchange with the cooling water 41, and thus the temperature of the power element 3a and the temperature of the cooling water 41 are basically about the same, or the cooling water temperature is higher. However, when the electric current applied to the power element 3a is high, the cooling carried out by the cooling water 41 cannot keep up with the temperature rise of the power element 3a, and there are cases in which the temperature of the power element 3a becomes higher than the cooling water temperature.

That is, the "first determination temperature difference" which serves as a reference when the power element temperature is higher than the cooling water temperature, is the temperature which serves as a reference when carrying out an abnormality determination of the temperature sensor 51 during a situation in which a high electric current is applied to the power element 3a and the power element temperature is thought to be raised. Therefore, the "first determination temperature difference" is obtained by adding the detection error and the determination margin, as well as the power element temperature (temperature rise) which will rise when a motor electric current value (the first electric current determination value lmth1), which is determined to be high, is applied, as illustrated in FIG. 3. Thereby, even if the temperature rise of the power element 3a exceeds the cooling performance of the cooling water 41 and the temperature of the power element 3a reaches the maximum heat generation temperature, since this temperature rise is taken into account for the first determination temperature difference, the abnormality determination of the temperature sensor 51 can be carried out appropriately.

On the other hand, the "second determination temperature difference" is a value which serves as a reference when determining an abnormality of the temperature sensor 51 while the power element temperature is lower than the cooling water temperature. Here, when the power element temperature is lower than the cooling water temperature is when cooling is sufficiently carried out by the cooling water 41, and the temperature rise of the power element 3a is suppressed. Therefore, it is considered that the power element temperature and the cooling water temperature do not differ significantly.

That is, the "second determination temperature difference" which serves as a reference when the power element temperature is lower than the cooling water temperature, is the value which serves as a reference when carrying out an abnormality determination of the temperature sensor 51 during a situation in which cooling by the cooling water 41 is sufficiently functioning and it is considered that the power element temperature and the cooling water temperature will not differ significantly. Therefore, the "second determination temperature difference" is obtained by adding just the detection error and the determination margin, as illustrated in FIG. 3. Thus, even if the power element temperature and the cooling water temperature do not differ significantly, that is, even if the output of the temperature sensor 51 and the output of the water temperature sensor 52 do not differ greatly, an abnormality of the temperature sensor 51 can be determined.

Additionally, once the first determination temperature difference and the second determination temperature difference are calculated, in the flowchart illustrated in FIG. 2, the process proceeds to step S6, and whether or not a predetermined necessary circulation time has elapsed since the start of the circulation of the cooling water 41 is determined. Then, if the necessary circulation time has not elapsed, the process proceeds to step S11, and an abnormality determination of the temperature sensor 51 is not carried out. Therefore, an abnormality determination of the temperature sensor 51 can be carried out after waiting for the temperature distribution of the cooling water 41 in the cooling water circulation path 42 to become even, thereby preventing an erroneous determination caused by a variation generated in the temperature distribution of the cooling water 41.

In addition, if the necessary circulation time has elapsed and the temperature distribution of the cooling water 41 can be determined to be even, the process proceeds to step S7 and whether or not the vehicle equipped with a motor unit 1 is stopped is determined. Then, if traveling (not stopped) the process proceeds to step S11 and the presence/absence of an abnormality of the temperature sensor 51 is not determined. That is, while the vehicle is traveling, the electric current applied to the power element 3a, which is a motor electric current, is increased in order for the motor 2 to output the necessary motor torque for traveling. Therefore, it is conceivable that the power element temperature rises and greatly deviates from the cooling water temperature. In such a case, the presence/absence of an abnormality of the temperature sensor 51 is not determined and thereby an erroneous determination can be prevented. On the other hand, when a vehicle is stopped, the motor 2 is not required to output a motor torque; therefore, the electric current applied to the power element 3a, which is a motor electric current, is decreased and the temperature rise of the power element 3a is suppressed. Accordingly, the power element temperature becomes lower than the cooling water temperature, and thus, an abnormality of the temperature sensor 51 can be determined even if the power element temperature and the cooling water temperature do not differ greatly. Additionally, since a traveling vehicle must always have a stopped state, frequency and opportunity for determining a sensor abnormality are sufficiently ensured, thereby achieving a balance between the abnormality detection ability and the determination frequency.

Additionally, if the vehicle is stopped, the process proceeds to step S8 and then to step S9, and whether or not the electric current flowing in the power element 3a is large is determined. Then, if the electric current flowing in the power element 3a is large, the process proceeds to step S11 and the abnormality determination of the temperature sensor 51 is not carried out. Therefore, if the electric current flowing in the power element 3a is large and the abnormality determination of the temperature sensor 51 cannot be carried out unless the power element temperature and the cooling water temperature differ greatly, the execution of the abnormality determination is withheld, and the occurring of an erroneous determination can be prevented.

Additionally, if the electric current applied to the power element 3a is not large, the process proceeds to step S10, and whether or not the electric current applied to the power element 3a is small is determined. Then, if the electric current applied to the power element 3a is not small, that is, if the electric current applied to the power element 3a continuously remains greater than the second electric current determination value lmth2 for the length of the low motor electric current determination time Tth2, the process proceeds to step S11, and the abnormality determination of the temperature sensor 51 is not carried out. Here, for example, if a large electric current is applied to the power element 3a, the temperature of the power element 3a is raised, and a sensor abnormality cannot be determined unless the power element temperature and the cooling water temperature differ greatly. However, subsequently, if the electric current applied to the power element 3a continuously remains lower than the second electric current determination value lmth2 for the length of the low motor electric current determination time Tth2, a state in which a temperature rise of the power element 3a is suppressed will continue for a certain length of time (the low motor electric current determination time Tth2), and the temperature of the power element 3a decreases. In other words, the power element temperature becomes lower than the cooling water temperature, and an abnormality of the temperature sensor 51 can be determined, even if the power element temperature and the cooling water temperature do not differ greatly.

On the other hand, if the motor electric current is determined to be small, the process proceeds to steps S12→S13→S14, and the temperature difference ΔT and the first determination temperature difference are compared. Then, if the temperature difference ΔT exceeds the first determination temperature difference, the process proceeds to step S16, and it is determined that there is an abnormality in the temperature sensor 51. At this time, since a first determination time is set, the influence of noise of the power element temperature and the cooling water temperature can be avoided.

Additionally, if the temperature difference ΔT is equal to or less than the first determination temperature difference, and thereby the determination in step S14 is YES, the process proceeds to S15, and the temperature difference ΔT is compared to the second determination temperature difference. Then, if the temperature difference ΔT falls below the second determination temperature difference, the process proceeds to step S16, and it is determined that there is an abnormality in the temperature sensor 51. Additionally, if the temperature difference ΔT is equal to or greater than the second determination temperature difference, the process proceeds to step S17, and it is determined that there is no abnormality in the temperature sensor 51. At this time, since a second determination time is set, the influence of noise of the power element temperature and the cooling water temperature can be avoided.

As described above, in the first embodiment, the determination temperature difference (the second determination temperature difference) of when the detected temperature of the temperature sensor 51 is lower than the detected water temperature of the water temperature sensor 52 is set to a lower value than the determination temperature difference (the first determination temperature difference) of when the detected temperature of the temperature sensor 51 is higher than the detected temperature of the water temperature sensor 52. That is, when the power element temperature is higher than the cooling water temperature, the temperature rise amount of the power element 3a is added to the first determination temperature difference, but the temperature rise amount of the power element 3a is not included in the second determination temperature difference of when the power element temperature is lower than the second determination temperature difference.

This is because the heat generation of the power element 3a only needs to be considered when the power element temperature is higher than the cooling water temperature, and accordingly, the determination temperature difference (the second determination temperature difference) of when the power element temperature is higher than the cooling water temperature can be set to a relatively small value, and the abnormality determination performance is improved.

On the other hand, by adding the temperature rise amount of the power element 3a to the first determination temperature difference, even if the difference between the cooling water temperature and the power element temperature increases due to the temperature rise of the power element temperature caused by the electric current applied to the power element 3a, an erroneous determination that an abnormality has occurred in the temperature sensor 51 can be prevented.

When setting the temperature rise in step S3 shown in FIG. 2, the electric current applied to the power element 3a can be set to less than the maximum electric current of the system to which the invention is applied. This is because the first determination temperature difference includes a detection error and a determination margin. Additionally, by setting the temperature rise amount to be included in the first determination temperature difference as a "temperature rise amount during vehicle stop", the added temperature rise value will become small, and an abnormality can be detected even if the difference between the outputs of the temperature sensors is small, thereby improving the abnormality determining performance. On the other hand, by setting the temperature rise amount to be included in the first determination temperature difference as a "the temperature rise amount during maximum electric current application", the diagnostic frequency can be increased. Thus, the weighting for the abnormality detecting performance and the diagnostic frequency can be arbitrarily set by adjusting the temperature rise value.

Also, when considering a case of executing the sensor abnormality determining steps of the first embodiment in a hybrid vehicle, the motor electric current (electric current applied to the power element 3a) by which an abnormality determination is made possible, can be set to, for example, the electric current during motor idling. Since there is necessarily a vehicle stopped state in a hybrid vehicle, a sensor abnormality determination can definitely be executed during a motor idling state, and since, at this time, the determination temperature difference (second determination temperature difference) is set to a small value, the abnormality determining performance can be improved. In this case, the first electric current determination value lmth1, which serves as a reference when the electric current applied to the power element 3a is determined to be high, can be set as the electric current applied to the power element 3a during motor idling.

Next, the effects are described. The effects listed below can be obtained with the sensor abnormality determining apparatus according to the first embodiment.

(1) The sensor abnormality determining apparatus is applied to a semiconductor module (inverter) 3 that is provided with: a power element 3a; a cooling water circuit (cooling water circulation path) 42 having cooling water 41 for cooling the power element 3a circulating therein; a temperature sensor 51 that detects a temperature of the power element 3a; and a water temperature sensor 52 that detects a temperature of the cooling water 41 circulating in the cooling water circulation path 42, the apparatus is provided with: an abnormality determining section 5a, which determines that the temperature sensor 51 is abnormal when a temperature difference $\Delta T$ between the temperature detected by the temperature sensor 51 and the water temperature detected by the water temperature sensor 52 is larger than a previously set determination temperature difference; and a determination temperature setting section 5b whereby the determination temperature difference (the second determination temperature difference) for the time when the temperature detected by the temperature sensor 51 is lower than the water temperature detected by the water temperature sensor 52 is set at a lower value than the determination temperature difference (the first determination temperature difference) for the time when the temperature detected by the temperature sensor 51 is higher than the water temperature detected by the water temperature sensor 52. Thus, an abnormality of the temperature sensor, which detects the power element temperature, can be determined, even when the deviation between the temperature of the power element 3a and the temperature of the cooling water 41 for cooling the power element 3a is small.

(2) The semiconductor module (inverter) 3 is provided with a current sensor 53 which detects an electric current applied to the power element 3a, wherein the abnormality determining section 5a is configured such that an abnormality determination of the temperature sensor 51 is not executed when the electric current applied to the power element 3a is equal to or greater than a first electric current determination value lmth1 set in advance. Thus, in addition to the effect of (1) described above, an occurrence of an erroneous determination can be prevented by withholding the execution of an abnormality determination, when a large current is applied to the power element 3a and an abnormality determination of the temperature sensor 51 cannot be executed unless the power element temperature and the cooling water temperature differ greatly.

(3) The abnormality determining section 5a is configured such that an abnormality determination of the temperature sensor 51 is executed if an electric current applied to the power element 3a remains in a state of being equal to or less than a second electric current determination value lmth2, set in advance, for a predetermined length of time (the low motor electric current determination time Tth2). Thus, in addition to the effects of (1) or (2) described above, a sensor abnormality determination can be carried out by waiting until the temperature of the power element 3a is reduced, even if the power element temperature is raised, and an abnormality of the temperature sensor 51 can be determined, even if the power element temperature and the cooling water temperature do not differ greatly.

(4) The semiconductor module (inverter) 3 is a control circuit of the motor 2 installed on a vehicle as a travel drive source of the vehicle, wherein the abnormality determining section 5a is configured such that an abnormality determination of the temperature sensor 51 is executed when the vehicle is in a stopped state. Thus, in addition to the effect of any one of (1)-(3) described above, if the vehicle is traveling, the electric current applied to the power element 3a increases in order to cause the motor 2 to output the necessary motor torque for traveling, thereby causing the power element temperature to rise, and deviate greatly from the cooling water temperature. In such a case, the presence/absence of an abnormality of the temperature sensor 51 is not determined and thereby an erroneous determination can be prevented.

(5) The abnormality determining section 5a is configured such that an abnormality determination of the temperature sensor 51 is executed when a predetermined length of time (time necessary for circulation) has elapsed since the circulation of the cooling water 41 for cooling the power element 3a has started. Thus, in addition to the effect of any one of (1)-(4) described above, an abnormality determination of the temperature sensor 51 can be carried out after waiting for the temperature distribution of the cooling water 41 in the cooling water circulation path 42 to become even, thereby preventing an erroneous determination caused by the variation generated in the temperature distribution of the cooling water 41.

The sensor abnormality determining apparatus of the present invention was described above based on the first embodiment, but specific configurations thereof are not limited to the first embodiment, and various modifications and additions to the design can be made without departing from the scope of the invention according to each claim in the Claims.

In the first embodiment, an example was shown in which a water temperature sensor 52 detects the temperature of a cooling water 41 that flows in a power element water jacket 3b provided to a power element 3a, but the invention is not limited thereto. In a cooling system 4, the water sensor 52 needs only to detect the temperature of the cooling water 41 for cooling the power element 3a; therefore, for example, the sensor may detect the cooling water temperature immediately before flowing into the radiator 44, or immediately after being discharged from the water pump 43. Here, when the cooling water circulation path 42 between where the temperature sensor 52 is provided and the temperature sensor 51 of the power element 3a is long, or, the cooling water flow rate is low, the length of time before the cooling water 41, after contacting the power element 3a, comes into contact with the water temperature sensor 52, or, the length of time before the cooling water 41, after contacting the water temperature sensor 52, comes in contact with the power element 3a, becomes long. At this time, there is no problem if the temperature of the cooling water 41 is even within the cooling water 41 circulation path 42, but if variation (unevenness) is present in the temperature distribution, the unevenness in the temperature distribution will be added to the detected temperature difference of the temperature sensor 51 and the water temperature sensor 52. Consequently, erroneous determinations were made that an abnormality is occurring when there was no abnormality in the temperature sensor 51. In such a case, an erroneous determination can be avoided by giving consideration to the arrival time of the cooling water 41 to each sensor, and calculating the temperature difference $\Delta T$ of the two sensors.

Specifically, the length of time for the cooling water 41 to travel between sensors is obtained from the cooling water volume and the cooling water flow rate between the temperature sensor 51 and the water temperature sensor 52, when calculating the temperature difference $\Delta T$ in step S13 of the flowchart illustrated in FIG. 2. Then, by recording the past temperature information for this time period, the temperature difference from past temperatures may be obtained. That is, if the length of time for the cooling water 41 to move within the cooling water circulation path 42 from the power element 3a to the water temperature sensor 52, in that order, is n seconds, then: $\Delta T$=the power element temperature of n seconds prior–the current cooling water temperature Additionally, an abnormality determination of the temperature sensor 51 in the first embodiment is only performed while the vehicle is stopped, but in order to increase the diagnostic frequency, the temperature rise of the power element 3a may be obtained from the electric current applied to the power element 3a during steady running. In this case, while the determination temperature difference which serves as a reference for the abnormality determination is increased, the diagnostic opportunity can be increased. In this case, the first electric current determination value lmth1, which serves as a reference when determining that the electric current applied to the power element 3a is large, may be set as the electric current applied to the power element 3a during steady running.

Additionally, both abnormality determination controls of an abnormality determination during a motor idling, and an abnormality determination during steady running, may be implemented. In this case, during a motor idling when the determination temperature difference which serves as a reference for the abnormality determination is relatively small, a small abnormality (an abnormality in which the difference between the sensor outputs is small) can be detected. On the other hand, since an abnormality determination becomes executable even during steady running, which has a high frequency of occurrence, an increase in the abnormality determination frequency can be achieved. As a result, a balance between the abnormality detecting performance and the diagnostic frequency may be achieved. In this case, second electric current determination values lmth2 corresponding to the respective first electric current determination values lmth1 may be set. Additionally, by mapping the relationship between a power element electric current and a power element temperature rise, the temperature rise of the power element 3a may be appropriately obtained in accordance with the electric current applied to the power element 3a.

The invention claimed is:

1. A sensor abnormality determining apparatus applied to a semiconductor module that is provided with a power element, and a cooling water circuit having cooling water for cooling the power element circulating therein, the sensor abnormality determining apparatus comprising:
   a power element temperature sensor configured to detect a power element temperature of the power element;
   a water temperature sensor configured to detect a water temperature of the cooling water circulating in the cooling water circulation path;
   a controller programmed to include
      an abnormality determining section, which determines that the power element temperature sensor is abnormal when a temperature difference between the power element temperature detected by the power element temperature sensor and the water temperature detected by the water temperature sensor is higher than a previously set determination temperature difference; and
      a determination temperature setting section that sets the determination temperature difference to a lower value upon determining the power element temperature detected by the power element temperature sensor is lower than the water temperature detected by the water temperature sensor as compared to a value for the determination temperature difference upon determining the power element temperature detected by the power element temperature sensor is higher than the water temperature detected by the water temperature sensor.

2. The sensor abnormality determining apparatus according to claim 1, further comprising
a current sensor which detects an electric current applied to the power element,
wherein the abnormality determining section does not execute the abnormality determination of the power element temperature sensor upon determining the electric current applied to the power element is equal to or greater than a first electric current determination value, which is set in advance.

3. The sensor abnormality determining apparatus according to claim 1, wherein
the abnormality determining section executes the abnormality determination of the power element temperature sensor upon determining the electric current applied to the power element remains in a state of being equal to or less than a second electric current determination value, which is set in advance, for a predetermined length of time.

4. The sensor abnormality determining apparatus according to claim 1, wherein
the semiconductor module is a control circuit of a motor mounted on a vehicle as a travel drive source of the vehicle, and
the abnormality determining section executes the abnormality determination of the power element temperature sensor when the vehicle is in a stopped state.

5. The sensor abnormality determining apparatus according to claim 1, wherein
the abnormality determining section executes the abnormality determination of the power element temperature sensor when a predetermined length of time has elapsed since a circulation of cooling water for cooling the power element has started.

6. The sensor abnormality determining apparatus according to claim 2, wherein
the abnormality determining section executes the abnormality determination of the power element temperature sensor upon determining the electric current applied to the power element remains in a state of being equal to or less than a second electric current determination value, which is set in advance, for a predetermined length of time.

7. The sensor abnormality determining apparatus according to claim 6, wherein
the semiconductor module is a control circuit of a motor mounted on a vehicle as a travel drive source of the vehicle, and
the abnormality determining section executes the abnormality determination of the power element temperature sensor when the vehicle is in a stopped state.

8. The sensor abnormality determining apparatus according to claim 2, wherein
the semiconductor module is a control circuit of a motor mounted on a vehicle as a travel drive source of the vehicle, and
the abnormality determining section executes the abnormality determination of the power element temperature sensor when the vehicle is in a stopped state.

9. The sensor abnormality determining apparatus according to claim 3, wherein
the semiconductor module is a control circuit of a motor mounted on a vehicle as a travel drive source of the vehicle, and
the abnormality determining section executes the abnormality determination of the power element temperature sensor when the vehicle is in a stopped state.

10. The sensor abnormality determining apparatus according to claim 6, wherein
the abnormality determining section executes the abnormality determination of the power element temperature sensor when a predetermined length of time has elapsed since a circulation of cooling water for cooling the power element has started.

11. The sensor abnormality determining apparatus according to claim 2, wherein
the abnormality determining section executes the abnormality determination of the power element temperature sensor when a predetermined length of time has elapsed since a circulation of cooling water for cooling the power element has started.

12. The sensor abnormality determining apparatus according to claim 3, wherein
the abnormality determining section executes the abnormality determination of the power element temperature sensor when a predetermined length of time has elapsed since a circulation of cooling water for cooling the power element has started.

13. The sensor abnormality determining apparatus according to claim 4, wherein
the abnormality determining section executes the abnormality determination of the power element temperature sensor when a predetermined length of time has elapsed since a circulation of cooling water for cooling the power element has started.

* * * * *